United States Patent
Franke et al.

(10) Patent No.: US 6,912,765 B2
(45) Date of Patent: Jul. 5, 2005

(54) EASILY REMOVED HEATSINK CLIP

(75) Inventors: Gregory C. Franke, Houston, TX (US); Donald J. Hall, Magnolia, TX (US); Jeffrey A. Lambert, Cypress, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/663,349

(22) Filed: Sep. 16, 2003

(65) Prior Publication Data

US 2004/0134639 A1 Jul. 15, 2004

Related U.S. Application Data

(62) Division of application No. 10/021,812, filed on Dec. 14, 2001, now Pat. No. 6,668,431.

(51) Int. Cl.[7] ................................................. B23P 19/00
(52) U.S. Cl. ...................... 29/426.6; 29/426.5; 29/450; 29/525.01
(58) Field of Search .......................... 24/458, 459, 517, 24/457, 518, 296; 29/426.1, 426.5, 450, 525.01, 428, 426.6, 446; 361/704, 710, 386; 174/16.3; 165/80.3

(56) References Cited

U.S. PATENT DOCUMENTS

| | | | |
|---|---|---|---|
| 4,355,743 A | 10/1982 | Erthein | |
| 5,526,874 A | * 6/1996 | White | 165/80.3 |
| 5,638,258 A | 6/1997 | Lin | |
| 6,061,239 A | 5/2000 | Blomquist | |
| 6,108,207 A | 8/2000 | Lee | |
| 6,257,533 B1 | 7/2001 | Pei et al. | |
| 6,310,774 B1 | 10/2001 | Lee | |
| 6,318,452 B1 | 11/2001 | Lee | |
| D455,951 S | 4/2002 | Kozyra et al. | |
| 6,421,242 B1 | 7/2002 | Chen | |
| 6,430,051 B1 | * 8/2002 | Yang et al. | 361/704 |
| 6,466,445 B1 | * 10/2002 | Chen | 361/704 |
| 6,480,384 B2 | 11/2002 | Lo | |
| 6,507,489 B1 | * 1/2003 | McGowan et al. | 361/687 |
| 6,522,545 B2 | * 2/2003 | Shia et al. | 361/704 |
| 6,542,367 B2 | * 4/2003 | Shia et al. | 361/703 |
| 6,545,870 B1 | * 4/2003 | Franke et al. | 361/704 |
| 6,563,716 B1 | * 5/2003 | Truong et al. | 361/816 |
| 6,668,431 B2 | * 12/2003 | Franke et al. | 24/458 |
| 6,711,019 B2 | * 3/2004 | Manabe et al. | 361/704 |
| 6,778,395 B1 | * 8/2004 | Dong et al. | 361/704 |
| RE38,677 E | * 12/2004 | Blomquist | 361/704 |
| 2003/0218866 A1 | * 11/2003 | Chen et al. | 361/704 |
| 2004/0091311 A1 | * 5/2004 | Lin | 403/322.4 |
| 2004/0190262 A1 | * 9/2004 | Lai et al. | 361/704 |

* cited by examiner

*Primary Examiner*—Essama Omgba

(57) ABSTRACT

A clip is disclosed which is capable of applying significant retention force via a rotatable cam arm while being easily removable due to the cam arm and a separate removal arm. A method of using the clip is also disclosed which uses the advantages of the clip, particularly in the context of computer design and construction.

15 Claims, 3 Drawing Sheets

EASILY REMOVED HEATSINK CLIP

This application is a division of application Ser. No. 10/021,812, filed Dec. 14, 2001, now U.S. Pat. No. 6,688,431.

FIELD OF THE INVENTION

The present invention generally relates to the field of mechanical fasteners, and particularly to retention clips, specifically heatsink retention clips used to anchor heatsinks to heatsink retainers.

BACKGROUND OF THE INVENTION

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

In the field of computer design, processing chips, which perform the computational functions of a computer, typically generate substantial amounts of heat. This heat must be dispersed from around the chip to prevent malfunctions. To accomplish this, heatsinks are typically associated with the chips to provide a structure with high surface area to disperse the heat. As processing chips have grown both faster and hotter, heatsinks have grown proportionately larger and heavier. For example, current heatsinks may weigh more than a half pound to achieve the desired heat dissipating effect.

Retention clips are typically used to secure the heatsink to a heatsink retainer which positions the heatsink relative to the heat generating chip. As heatsinks have grown larger and heavier, the retention clips must in turn be stronger to avoid shifting. If a retention clip is too weak to secure the heatsink during shipping, the heatsink may pull loose, allowing the processing chip to come unseated due to their interface.

In addition to strong retention clips, however, there is also a need to make the clips easy to install and remove. Current clips must either be removed with a screwdriver or other tool or with a release tab or other mechanism requiring the application of significant force even after the release of any locking mechanism. Additionally, the use of release tabs and levers typically result in retention clips which enlarge or exceed the heatsink envelope, thereby increasing the footprint of the assembly and limiting the height of nearby elements. Such clips are difficult for factory personnel to remove not only due to the need to use a tool within a confined space to effect removal but also due to the force necessary to remove the stronger clips. Ideally, a retention clip would require low installation force, would possess high retention force, and would be easily removable.

SUMMARY OF THE INVENTION

The following passage is intended only to provide a brief summary of limited aspects of the present inventions and should not be construed as encompassing all necessary elements or steps of the inventions. The present invention is related generally to overcoming the deficiencies inherent in previous designs by allowing easy insertion and removal of a retention clip while providing adequate retention force. This aim is accomplished by providing designs comprising a simple release generally in the form of a pinchable release mechanism. Additionally methodologies are provided which include the act of using a pinchable release mechanism to effect the release of a heatsink retention clip.

BRIEF DESCRIPTION OF THE DRAWINGS

The invention will hereafter be described with reference to the accompanying drawings, wherein like reference numerals denote like elements, and.

DETAILED DESCRIPTION OF EXEMPLARY EMBODIMENTS

It will be appreciated that the present invention can take many forms and embodiments. Some embodiments of the invention are described so as to give an understanding of the invention. It is not intended, however, that the embodiments of the present invention that are described in this specification should limit the invention.

Figure 1:
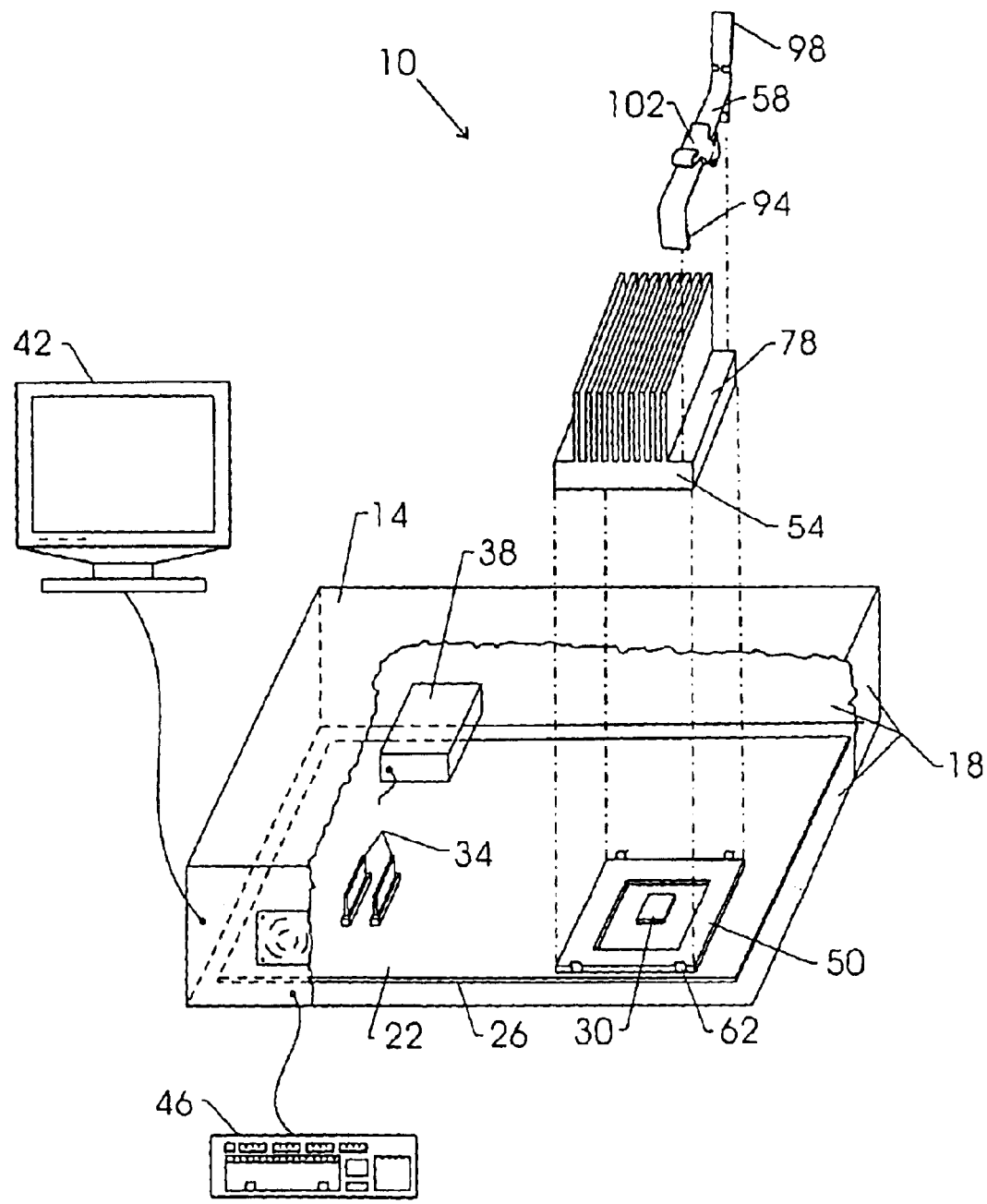
FIG. 1 is a cutaway view of a idealized computer system including an exploded view of a heatsink assembly.

Turning now to the drawings and referring initially to FIG. 1, there is depicted a cutaway, perspective view of an exemplary computer system 10. Computer system 10 comprises a chassis 14 which in turn is comprised of a number of chassis walls 18.

In addition, computer system 10 comprises a motherboard 22. Motherboard 22, in turn, comprises a board substrate 26 and components such as central processing unit 30, and memory components 34. Disposed about CPU 30 on motherboard 22 is a heatsink retainer 50. Mass storage device 38 also resides within the chassis and is connected to motherboard 22. In addition, computer system 10 comprises input and output devices such as monitor 42 and keyboard 46.

In the illustrated embodiment, heatsink retainer 50 possesses clip engagements 62 along the edges and generally disposed about the corners. As depicted, each clip engagement 62 is configured to receive a hooked member 94 comprising a part of a retainer clip 58. Alternatively clip engagement 62 may be configured as a projection such that the projection fits into a cutout window comprising a part of retainer clip 58.

In computer system 10, heatsink 54 is conformably engaged with retainer 50 such that the bottom of heatsink 54 is in contact with CPU 30. In the preferred embodiment, two retainer clips 58 are disposed along heatsink upper faces 78 and securely engage with clip engagements 62 of retainer 50 via hooked members 94. As depicted in FIG. 1, retainer clip 58 further comprises a cam arm 102 and a removal arm 98 which provide for easy engagement and removal of retainer clip 58 in the limited space of chassis 14.

As depicted, the heatsink assembly, comprising heatsink retainer 50 and heatsink 54, defines a three-dimensional spatial envelope. As illustrated, the addition of retainer clip 58 does not substantially increase the size or change the shape of the envelope. In an exemplary embodiment, the footprint of the envelope is generally square and remains square even after the addition of retainer clip 58.

Figure 2:
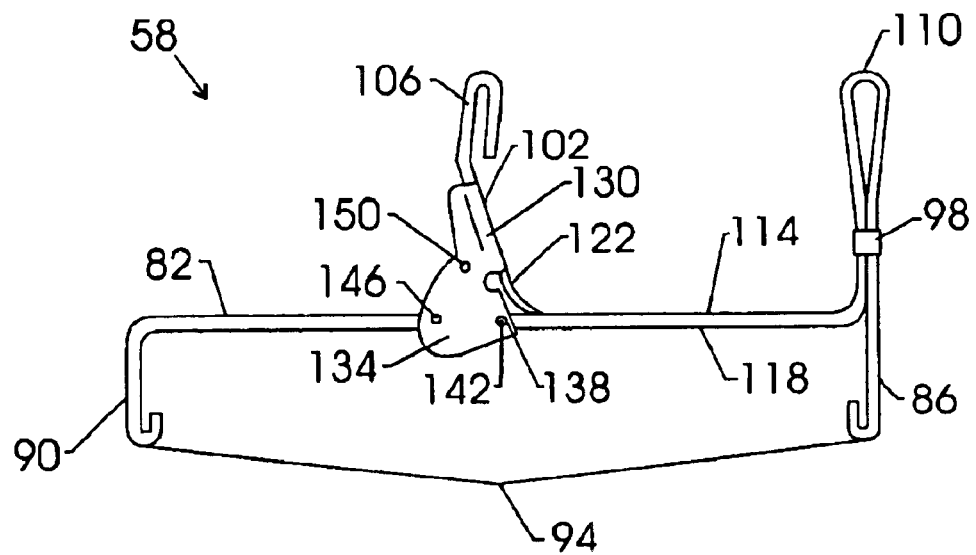
FIG. 2 is a side view of a heatsink retention clip.

FIG. 2 depicts an embodiment of the retainer clip of the present application. Retainer clip 58 is shown to comprise a clip body 82 of generally elongated nature. Clip body 82 comprises a clip top surface 114 and a clip bottom surface 118. Each end of clip body 82 comprises a retaining arm, a first retaining arm 86 and a second retaining arm 90, projecting downward relative to bottom surface 118. On the distal portion of first retaining arm 86 and second retaining arm 90 are hooked members 94 which serve to engage clip engagement 62. Alternatively, first retaining arm 86 and second retaining arm 90 may comprise cut out windows on their distal portion which engage conforming projections instead of clip engagements 62.

Additionally, clip body 82 comprises a removal arm 98 on one end projecting upward relative to top surface 114. Removal arm 98 may be a looped structure when clip body 82, first retaining arm 86, second retaining arm 90, and removal arm 98 all comprise a single unitary piece.

Retainer clip 58 also comprises a cam arm 102 generally centered along clip body 82. Cam arm 102 has an arm body 130 connected to two arm runners 134 such that each is located on a different side of arm body 130 and configured to span the width of clip body 82. Each runner 134 comprises a hinge hole 138 configured to receive a corresponding hinge pin 142 projecting from the side of clip body 82. The coupling on hinge pin 142 and hinge hole 138 allow cam arm 102 to partially rotate relative to clip body 82. Each runner 134 further comprises two pair of aligned, inward facing protrusions a pair of unlock protrusions 146 and a pair of lock protrusions 150. Both unlock protrusions 146 and lock protrusions 150 act to hinder, but not prevent, the free rotation of cam arm 102 relative to clip body 82 effectively preventing rotation of cam arm 102 absent the application of some minimal level of force.

Cam arm 102 may further comprise a lifting member 106 which is configured such that, when cam arm 102 is rotated generally perpendicular to clip body 82, lifting member is angled slightly away from clip body 82. Cam arm 102 also comprises rotation stop 122 configured to prevent rotation of cam arm 102 when cam arm is generally perpendicular to clip body 82.

In the embodiment illustrated in FIG. 2, cam arm 102 is connected to clip body 82 by hinge hole 138 and hinge pin 142 such that the rotation of cam arm 102 is toward removal arm 98. Rotation stop 122, however, prevents rotation toward removal arm 98 past a point which is generally parallel to removal arm 98 and generally perpendicular to clip body 82.

Figure 3:
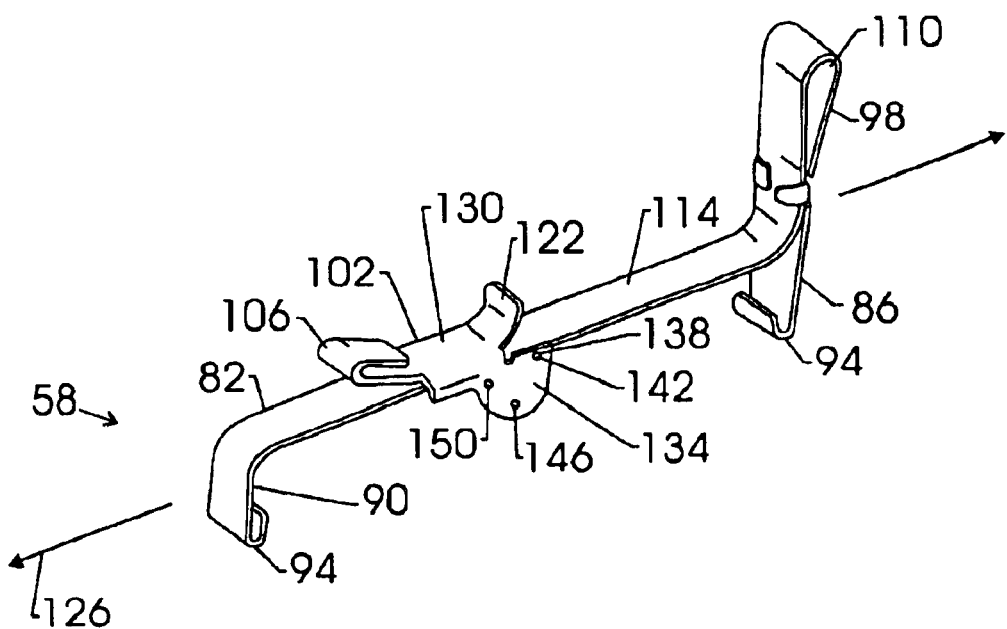
FIG. 3 is a perspective view of a heatsink retention clip in the locked position.

Referring now to FIG. 3, Retainer clip 58 is shown from a birdseye perspective in a locked configuration which would be typical of normal operation in the preferred embodiment. Longitudinal axis 126 is shown for reference running in the direction of clip body 82. In the locked configuration cam arm 102 is rotated such that it is generally parallel to clip body 82. In this position, lock protrusions 150 act to impede the free rotation of cam arm 102 from the locked position. A force exceeding some minimum required force must be applied to cam arm 102 to overcome the resistance of lock protrusions 150 when locking or unlocking the cam arm. Additionally, as depicted lifting member 106 and rotation stop 122 each are angled away from top surface 114 of clip body 82 when cam arm 102 is in the locked position.

As is also depicted in FIG. 3, in the locked position, runners 134 extend downward along the sides of clip body 82 in the same direction as the retaining arms 86, 90. Thus, referring back to FIG. 1, in the locked position, runners 134 exert force on heatsink upperface 78 and thereby securely hold heatsink 54 against CPU 30. In the locked position, clip bottom surface 118 is therefore not in contact with heatsink upper face 78. In this manner, the mechanical force generated by hinged cam arm 102 in conjunction with the engagement of hooked members 94 with clip engagements 62 allows greater force to be applied in securing heatsink 54 than would be possible in the absence of cam arm 102.

Figure 4:
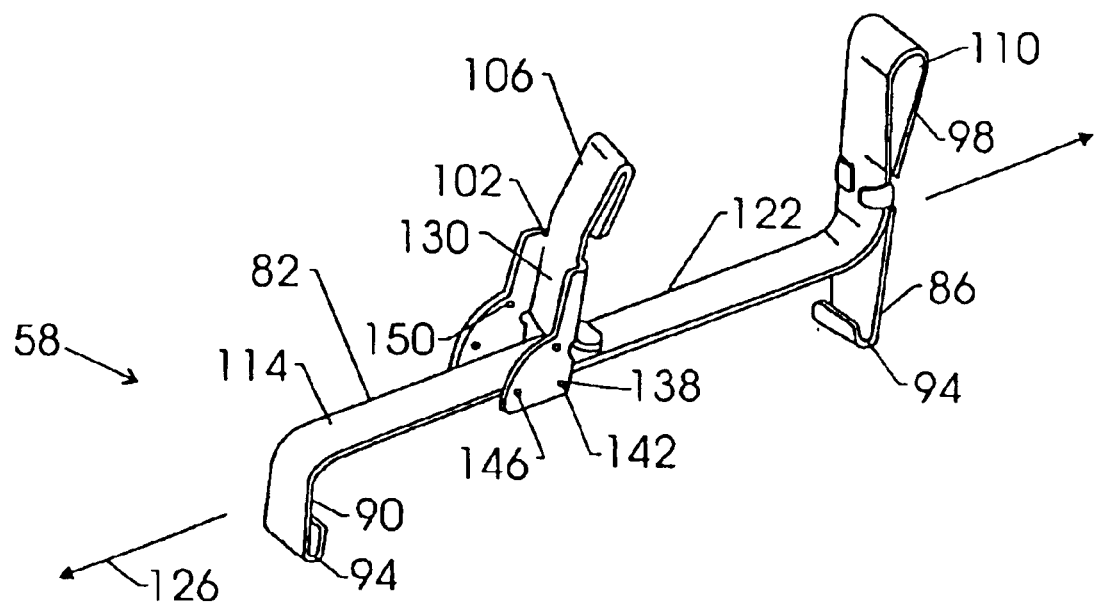
FIG. 4 is a perspective view of a heatsink retention clip in the unlocked position.

Referring now to FIG. 4, retainer clip 58 is shown from a birdseye perspective in an unlocked configuration which would be typical of removal or insertion in the preferred embodiment. To effect insertion of retainer clip 58, referring also to FIG. 1 for context, it will be presumed that heatsink 54 is disposed in an unsecured manner upon heatsink retainer 50. Retainer clip 58, while in an unlocked configuration, is then placed upon heatsink 54 such that clip bottom surface 118 rests on heatsink upper face 78.

To achieve this position a downward force will be applied to retainer clip 58 so that hooked members 94 can overcome the resistance provided by clip engagements 62. The rounded edges of hooked members 94 help to facilitate sliding past clip engagements 62. Alternatively, a pinching force my be applied to removal arm 98 and parallel cam arm 102 to provide a bend to clip body 82 and to thereby further separate the retaining arms 86, 90. In this manner, hooked members 94 may more easily be pushed past clip engagements 62. When hooked member 94 are in position relative to clip engagements 62 and when clip bottom surface 118 is resting upon heatsink upper face 78, cam arm 102 may be rotated to a locked position to secure heatsink 54 to CPU 30. To effect this rotation of cam arm 102, the resistances provided by unlock protrusions 146 and lock protrusion 150 must be overcome with a sufficient force.

To effect removal of retainer clip 58 from a locked position cam arm 102 is rotated from the locked position, generally parallel to clip body 82 to the unlocked position, roughly parallel to removal arm 98. This is done by overcoming the resistances provided by lock protrusions 150 and unlock protrusions 146. Once in the unlocked position, runners 134 will no longer be securing heatsink 54 to retainer 50, and hooked members 94 should be disengaged from clip engagements 62. If hooked members 94 are not disengaged from clip engagements 62 a downward force may be applied to retainer clip 58 to achieve this disengagement.

Next a pinching force is applied using removal arm 98 and now parallel cam arm 102. The pinching arm effects a distortion of clip body 82 which acts to further separate the retaining arms 86, 90. The separation of the retaining arms 86, 90, and therefore the separation of hooked members 94, allows for easy lifting of hooked members 94 past clip engagements 62. Once hooked members 94 are clear of clip engagements 62, retaining clip 58 may be easily and completely removed from the heatsink assembly. As noted above, an alternative embodiment would replace hooked member 94 with windowed cutouts and clip engagements 62 with fitted projections. However, operation of the retainer clip 58 would remain the same in this alternative embodiment.

Due to the presence of the partially rotatable cam arm 102 and removal arm 98, removal of retainer clip 58 can be accomplished without the use of any tools, such as a screwdriver or other prying instrument. The pinch removal system combined with the mechanically efficient hinged cam arm allows the use of a more powerful retainer clip, a necessity due to the increasing weight of heatsinks, while still allowing easy insertion and removal. In one exemplary embodiment, the retainer clip of this application is capable of applying the 70 lbs. of force to securely hold a heatsink, thereby preventing a processor from pulling out in a drop test.

While the invention is susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the appended claims.

What is claimed is:

1. A method of installing a retainer clip comprising:
   applying force together and in opposite directions to a removal arm located on one end of a retainer clip body and a rotatable cam arm located generally in the middle of the retainer clip body, wherein the cam arm is rotated to a position generally parallel to the removal arm, such that the force temporarily deforms the retainer clip body such that a first latching portion and a second latching portion of the retainer clip are separated;
   lowering the retainer clip onto a retaining member such that the first latching portion and the second latching portion advance beyond respective first and second engagement structures located on the retaining member; and
   releasing the removal arm and the cam arm such that the retainer clip body is no longer deformed and the first and second latching portions engage with their respective first and second engagement structures.

2. The method of claim 1, further comprising the act of rotating the cam arm to a position generally parallel to the retainer clip body.

3. The method of claim 2, further comprising the act of disposing a retained component between the retainer clip body and the retaining member.

4. The method of claim 3, wherein the act of rotating presses the retained component against the retaining member due to the action of two or more cam arm side structures which extend beneath the retainer clip body when the cam arm is generally parallel to the retainer clip body.

5. A method of installing a retainer clip comprising:
   providing a retainer clip comprising a retainer clip body, wherein the retainer clip is configured such that applying force together and in opposite directions to a removal arm, located at one end of the retainer clip body, and a rotatable cam arm, located generally in the middle of the retainer clip body, temporarily deforms the retainer clip body such that a first latching portion and a second latching portion of the retainer cup are separated; and
   pressing the retainer clip onto a retaining member such that the first latching portion and the second latching portion engage respective first and second engagement structures located on the retaining member.

6. The method of claim 5, comprising the act of disposing a retained component between the retainer clip body and the retaining member.

7. The method of claim 5, comprising the act of rotating the cam arm to a position generally parallel to the retainer clip body.

8. The method of claim 7, wherein the act of rotating presses a retained component against the retaining member due to the action of two or more cam arm side structures which extend beneath the retainer clip body when the cam arm is generally parallel to the retainer clip body.

9. The method of claim 5, wherein the rotatable cam arm is rotated to a position generally parallel to the retainer clip body prior to pressing the retainer clip onto a retaining member.

10. A method of manufacturing a computer system comprising:
    providing a circuit board comprising a retaining member;
    disposing a retained component on the retaining member;
    providing a retainer clip comprising a retainer clip body, wherein the retainer clip is configured such that applying force together and in opposite directions to a removal arm, located at one end of the retainer clip body, and a rotatable cam arm, located generally in the middle of the retainer clip body, temporarily deforms the retainer clip body such that a first latching portion and a second latching portion of the retainer clip are separated; and
    securing the retained component to the retaining member by pressing the retainer clip onto the retaining member such that the first latching portion and the second latching portion engage respective first and second engagement structures located on the retaining member.

11. The method of claim 10, comprising the act of rotating the cam arm to a position generally parallel to the retainer clip body.

12. The method of claim 11, wherein the act of rotating presses the retained component against the retaining member due to the action of two or more cam arm side structures which extend beneath the retainer clip body when the cam arm is generally parallel to the retainer clip body.

13. The method of claim 10 wherein the rotatable cam arm is rotated to a position generally parallel to the retainer clip body prior to pressing the retainer clip onto the retaining member.

14. The method of claim 10 wherein the retained component comprises a heatsink.

15. The method of claim 10 wherein the circuit board comprises a mother board.

* * * * *

UNITED STATES PATENT AND TRADEMARK OFFICE
CERTIFICATE OF CORRECTION

| | |
|---|---|
| PATENT NO. | : 6,912,765 B2 |
| APPLICATION NO. | : 10/663349 |
| DATED | : July 5, 2005 |
| INVENTOR(S) | : Gregory C. Franke et al. |

It is certified that error appears in the above-identified patent and that said Letters Patent is hereby corrected as shown below:

In column 5, line 53, in Claim 5, delete "cup" and insert -- clip --, therefor.

Signed and Sealed this

Fourteenth Day of September, 2010

David J. Kappos
*Director of the United States Patent and Trademark Office*